United States Patent
Sasaki et al.

(10) Patent No.: US 7,070,289 B2
(45) Date of Patent: Jul. 4, 2006

(54) CATOPTRIC PROJECTION OPTICAL SYSTEM

(75) Inventors: Takahiro Sasaki, Tochigi (JP); Toshihiro Sunaga, Tochigi (JP); Koshi Hatakeyama, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 89 days.

(21) Appl. No.: 10/783,788

(22) Filed: Feb. 20, 2004

(65) Prior Publication Data

US 2004/0165255 A1    Aug. 26, 2004

(30) Foreign Application Priority Data

Feb. 21, 2003    (JP)    ............................. 2003-044891

(51) Int. Cl.
*G02B 5/10* (2006.01)

(52) U.S. Cl. ........................ 359/859; 359/857; 359/858
(58) Field of Classification Search ................ 359/359, 359/850, 857–859, 861
See application file for complete search history.

(56) References Cited

U.S. PATENT DOCUMENTS

| | | | |
|---|---|---|---|
| 6,033,079 A | | 3/2000 | Hudyma |
| 6,262,836 B1* | | 7/2001 | Hudyma et al. ............ 359/366 |
| 6,318,869 B1 | | 11/2001 | Hudyma |
| 6,361,176 B1 | | 3/2002 | Mashima |
| 2002/0114089 A1 | | 8/2002 | Dinger et al. |
| 2003/0147131 A1* | | 8/2003 | Terasawa ..................... 359/366 |

FOREIGN PATENT DOCUMENTS

| | | |
|---|---|---|
| EP | 1 209 503 | 5/2002 |
| WO | WO 02/056114 A2 | 7/2002 |

OTHER PUBLICATIONS

Korean Office Action (Notice of Remarks Filing) mailed Aug. 31, 2005 with English language translation.

* cited by examiner

*Primary Examiner*—Drew A. Dunn
*Assistant Examiner*—Joshua L Pritchett
(74) *Attorney, Agent, or Firm*—Morgan & Finnegan, LLP (57) ABSTRACT

A catoptric projection optical system for projecting a pattern on an object surface onto an image surface includes plural mirrors, wherein a second mirror from the image surface through the optical path receives convergent pencil of rays, and has a paraxial magnification of −0.14 or smaller.

3 Claims, 4 Drawing Sheets

CATOPTRIC PROJECTION OPTICAL SYSTEM

This application claims a benefit of priority based on Japanese Patent Application No. 2003-044891, filed on Feb. 21, 2003, which is hereby incorporated by reference herein in its entirety as if fully set forth herein.

BACKGROUND OF THE INVENTION

The present invention relates generally to an exposure apparatus, and more particularly to a reflection type or catoptric projection optical system, and an exposure apparatus using the same which use ultraviolet ("UV") and extreme ultraviolet ("EUV") light to expose an object, such as a single crystal substrate for a semiconductor wafer, and a glass plate for a liquid crystal display ("LCD").

Recent demands for smaller and lower profile electronic devices have increasingly demanded finer semiconductor devices to be mounted onto these electronic devices. For example, the design rule for mask patterns has required that an image with a size of a line and space ("L & S") of less than 0.1 µm be extensively formed. It is expected to require circuit patterns of less than 80 nm in the near future. L & S denotes an image projected onto a wafer in exposure with equal line and space widths, and serves as an index of exposure resolution.

A projection exposure apparatus as a typical exposure apparatus for fabricating semiconductor devices includes a projection optical system for exposing a pattern on a mask or a reticle, onto a wafer. The following equation defines the resolution R of the projection exposure apparatus (i.e., a minimum size for a precise image transfer) where $\lambda$ is a light-source wavelength and NA is a numerical aperture of the projection optical system:

$$R = k_1 \times \frac{\lambda}{NA} \quad (1)$$

As the shorter the wavelength becomes and the higher the NA increases, the higher or finer the resolution becomes. The recent trend has required that the resolution be a smaller value; however it is difficult to meet this requirement using only the increased NA, and the improved resolution expects use of a shortened wavelength. Exposure light sources have currently been in transition from KrF excimer laser (with a wavelength of approximately 248 nm) and ArF excimer laser (with a wavelength of approximately 193 nm) to $F_2$ excimer laser (with a wavelength of approximately 157 nm). Practical use of the EUV light is being promoted as a light source.

As a shorter wavelength of light narrows usable glass materials for transmitting the light, it is advantageous for the projection optical system to use reflective elements, i.e., mirrors instead of refractive elements, i.e., lenses. No applicable glass materials have been proposed for the EUV light as exposure light, and a projection optical system cannot include any lenses. It has thus been proposed to form a catoptric projection optical system only with mirrors (e.g., multilayer mirrors).

A mirror in a catoptric reduction projection optical system forms a multilayer coating to enhance reflected light and increase reflectance. The multilayer mirror is characterized in that when it is optimized so as to provide high reflectance to light at a small incident angle, it can provide high reflectance to high at a large incident angle distribution, whereas when it is optimized so as to provide high reflectance to light at a large incident angle, it cannot provide high reflectance to only light at a small incident angle distribution.

More specifically, a multilayer mirror including 40 layers of molybdenum and silicon at a uniform period has an incident-angle range for reflectance of 60% or greater of 0° to 13° when the multilayer mirror is optimized to the incident angle of 0°, and 10° to 17° when the multilayer mirror is optimized to the incident angle of 15°. A multilayer coating with a complex structured, such as a graded multilayer coating that modulates a period of the multilayer according to positions, needs for a large incident angle distribution.

The smaller number of mirrors is desirable to increase reflectance for the entire optical system. In addition, the projection optical system preferably uses the even number of mirrors to avoid mechanical interference between a mask and wafer by arranging them at opposite sides with respect to a pupil.

As the EUV exposure apparatus has requires a smaller critical dimension or resolution than a conventional one, higher NA is necessary (e.g., up to 0.2 for a wavelength of 13.4 nm). Nevertheless, conventional three or four mirrors have a difficulty in reducing wave front aberration. Accordingly, the increased number of mirrors, such as six, as well as use of an aspheric mirror, is needed so as to increase the degree of freedom in correcting the wave front aberration. Hereinafter, such an optical system is referred to as a six-mirror system in the instant application. The six-mirror system has been disclosed, for example, in U.S. Pat. No. 6,033,079, and International Publication No. WO 02/056114A2.

U.S. Pat. No. 6,033,079 discloses two typical six-mirror catoptric projection optical systems, which receive light from the object surface, form an intermediate image via first to fourth reflective surfaces, and re-form the intermediate image on an image surface via a convex fifth reflective surface and a concave sixth reflective surface. Such a structure contributes to high NA by enlarging and introducing light to sixth reflective surface and condensing the entire light on the image surface. Thus, the sixth reflective surface has a large effective diameter. The intermediate image should be formed after the fourth reflective surface to introduce the light into the fifth reflective surface while preventing the sixth reflective surface from shielding the light.

In this case, divergent light enters the fifth reflective surface, increasing the incident-angle distribution on the fifth reflective surface. The first embodiment discloses an optical system that has an arc-shaped image with a width of 1 mm and NA=0.25, and the maximum incident angle is 17.1° and the minimum incident angle is 0.4° on the fifth reflective surface. Therefore, the incident-angle distribution is 16.7°.

As a consequence, a distribution between the maximum and minimum incident angles on the fifth reflective surface significantly deteriorates the reflectance and lowers the throughput on the above multilayer coating.

On the other hand, International Publication No. WO 02/056114A2 also discloses a six-mirror catoptric projection optical system. Different from ones disclosed in U.S. Pat. No. 6,033,079, this catoptric projection optical system forms an intermediate image after the second reflective surface and introduces roughly collimated light into the fifth reflective surface. This catoptric projection optical system somewhat improves an incident angle by introducing collimated light into the fifth reflective surface. For example, for an arc-shaped field with NA=0.25 and a width of 2 mm, the maximum incident angle is 17° and the minimum incident angle is 5.5° on the fifth reflective surface. Therefore, the incident-angle distribution is 11.4°.

Still, this incident-angle distribution is not sufficiently small, and the deteriorated reflectance on the fifth reflective surface lowers throughput. In addition, the first concave reflective surface increases an angle between exit light from the first reflective surface and the optical axis, causing the third and fourth reflective surfaces to have extremely large effective diameters. In particular, an effective diameter of the fourth reflective surface is assumed to be 650 mm when NA is made 0.25, and thus is not viable due to the large size of the apparatus and difficult processing measurements.

In view of the current inefficient EUV light source, high throughput needs an improvement of the deteriorated reflectance on the fifth reflective surface.

BRIEF SUMMARY OF THE INVENTION

Accordingly, it is an exemplified object of the present invention to provide a six-mirror catoptric projection optical system with a high NA and excellent imaging performance, and an exposure apparatus using the same, which are applicable to the EUV lithography, and reduce a maximum effective diameter and an overall length of the optical system.

A catoptric projection optical system of one aspect according to the present invention for projecting a pattern on an object surface onto an image surface includes plural mirrors, wherein a second mirror from the image surface through the optical path receives convergent pencil of rays, and has a paraxial magnification of −0.14 or smaller. A catoptric projection optical system of another aspect according to the present invention for projecting a pattern on an object surface onto an image surface includes plural mirrors, wherein a second mirror from the image surface through the optical path receives convergent pencil of rays, and an angle between two marginal rays of the convergent pencil of rays plane is 3° or greater in meridional plane when the catoptric projection optical system has a numerical aperture of 0.25 or greater.

The catoptric projection optical system includes, for example, six or more mirrors. A third mirror from the image surface through the optical path may have the largest effective diameter among the plural mirrors. All of the plural mirrors may be aspheric mirrors including a multilayer coating that reflect light having a wavelength of 20 nm or smaller. The catoptric projection optical system may project light from a reflection mask that is arranged on the object surface. The catoptric projection optical system may be non-telecentric at a side of object surface.

A catoptric projection optical system of still another aspect according to the present invention for projecting a pattern on an object surface onto an image surface includes six mirrors that include, in order from the object surface to the image surface on an optical path, a first mirror, a second mirror, a third mirror, a fourth mirror, a fifth mirror, and a sixth mirror to sequentially reflect light, wherein the first mirror has a convex or plane shape, and the fifth mirror receives convergent pencil of rays.

The fifth mirror preferably has a paraxial magnification of −0.14 or smaller. An angle between two marginal rays of the convergent pencil of rays received by M5 is 3° or greater in meridional plane when the catoptric projection optical system has a numerical aperture of 0.25 or greater.

The fifth mirror may have a paraxial magnification between −30 and −0.4. The catoptric projection optical system may include, in order of from the object surface to the image surface, the second mirror, the first mirror, the fourth mirror, the sixth mirror, the third mirror and the fifth mirror, wherein an intermediate image may be formed between the fourth and third mirrors. The intermediate image may be formed between the fourth and sixth mirrors or between the six and third mirrors.

The six mirrors may form an intermediate image. The intermediate image may not accord with a surface of one of the six mirrors. All of six mirrors may be arranged between the object surface and the image surface. The second mirror from the image surface through the optical path may have a paraxial magnification between −30 and −0.4. An angle between two marginal rays of the convergent pencil of rays received by the second mirror from the image surface is 9° or greater in meridional plane, when the catoptric projection optical system has a numerical aperture of 0.25.

An exposure apparatus of another aspect according to the present invention includes the above catoptric projection optical system, and a mask stage that supports a mask having the pattern, and positions the pattern on the mask onto the object surface, a wafer stage that supports an object having a photosensitive layer, and positions the photosensitive layer on the image surface, and a mechanism for synchronously scanning the mask stage and the wafer stage while the mask is illuminated by light having a wavelength of 20 nm or smaller.

An exposure apparatus of still another aspect according to the present invention includes an illumination optical system for illuminating a pattern with light from a light source, and the above catoptric projection optical system. The catoptric projection optical system may project light reflected on the pattern, onto the image surface.

A device fabricating method includes the steps of exposing an object using the above exposure apparatus, and developing the exposed object. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
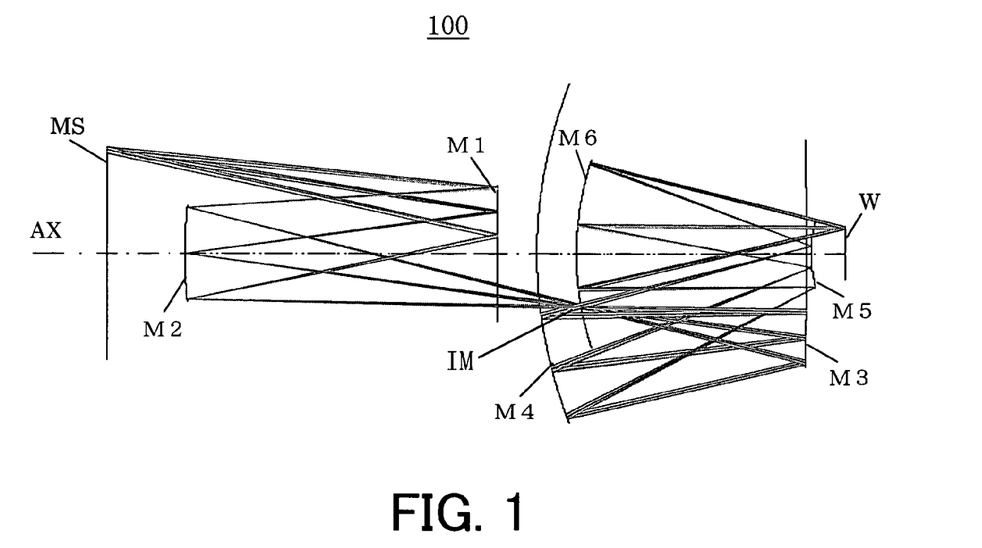
FIG. 1 is a schematic structure of a catoptric projection optical system of one embodiment according to the present invention.
Figure 2:
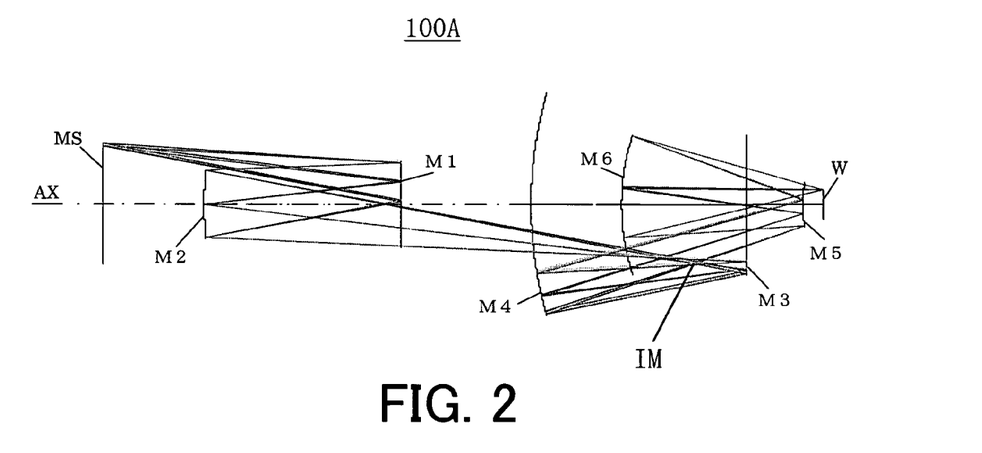
FIG. 2 is a schematic structure of a catoptric projection optical system of another embodiment according to the present invention.

A description will now be given of catoptric projection optical systems 100 and 100A and an exposure apparatus 200 as one aspect of the present invention with reference to the accompanying drawings. The same reference numeral in each figure denotes the same element, and a description thereof will be omitted. Here, FIG. 1 is a schematic structure of the catoptric projection optical system 100. FIG. 2 is a schematic structure of the catoptric projection optical system 100A. Unless otherwise specified, the catoptric projection optical system 100 generalizes the catoptric reduction projection optical system 100A.

Referring to FIG. 1, the inventive catoptric projection optical system 100 reduces and projects a pattern on an object surface (MS), such as a mask surface, onto an image surface (W), such as a substrate surface and an object surface to be exposed. The catoptric projection optical system 100 is an optical system particularly suitable for the EUV light (with a wavelength between 10 nm and 15 nm, preferably between 13.4 nm and 13.5 nm).

The inventive catoptric projection optical system 100 has six mirrors including, in order of sequential reflections of light from an object surface MS, a first (convex or plane) mirror M1, a second (concave) mirror M2, a third (plane) mirror M3, a fourth (concave) mirror M4, a fifth (convex) mirror M5, and a sixth (concave) mirror M6. The first and second mirrors M1 and M2 form an intermediate image IM, which is in turn re-imaged on an image surface W by the third to six mirrors M3 to M6.

Since the fifth mirror M5 usually has a large incident angle and a large incident-angle distribution, deteriorated reflectance becomes a problem for an applied multilayer coating. However, the inventive catoptric projection optical system 100 maintains the reflectance by introducing convergent pencil of rays into the fifth mirror M5.

The catoptric projection optical system 100 does not accord the mirror position with the intermediate image IM surface, reducing aberration that would otherwise occur due to the dust and energy concentrations. Since the catoptric projection optical system 100 arranges an aperture stop on the second mirror M2, and facilitates an arrangement of the aperture stop. In addition, the catoptric projection optical system 100 arranges all the mirrors between the object surface MS and the image surface W, and facilitates arrangements of mask and wafer stages, etc.

The inventive catoptric projection optical system 100 also has advantages in that the fourth mirror M4 has a maximum but reduced effective diameter among the six mirrors, and the overall length of the optical system is short, as described later.

The catoptric projection optical system 100 is so non-telecentric to light incident upon the first mirror M1 from the object surface MS, and telecentric to the exit light at the image surface W side. For example, the object surface MS side needs a certain incident angle, in order to illuminate a mask arranged on the object surface MS through an illumination optical system, and to form an image on a wafer located at the image surface W. On the other hand, the image surface W side is preferably telecentric to reduce a change of magnification, for example, when the wafer located at the object surface MS moves in the optical axis direction.

The inventive projection optical system 100 is arranged substantially as a coaxial optical system that is axially symmetrical around one optical axis, has an advantage in that an arc-shape image field around the optical axis can preferably correct aberration. However, the six mirrors in the catoptric projection optical system 100 do not have to be arranged perfectly coaxial for aberrational corrections or adjustments. For example, they may slightly decenter for aberrational improvements or improve the degree of freedom in arrangement.

The catoptric projection optical system is indispensable to the EUV optical system, and required to reduce light shielding at the image surface W side as higher NA is demanded. In order to form a desired optical system with high NA and reduced light shielding, the instant embodiment forms the intermediate image IM between the second and third mirrors M2 and M3, and enhances powers of the fifth and sixth mirrors M5 and M6. Preferably, the fifth and sixth mirrors M5 and M6 are convex and concave mirrors, respectively, for imaging with high NA and maintained back focus. Here, the "back focus" means an interval between the surface closest to the image surface and the image surface (W).

In the catoptric projection optical system 100, the first mirror M1 is preferably a convex or plane mirror to reduce an angle between the exit light from the first mirror M1 and the optical axis. Where r1 to r6 are radii of curvature of the first to sixth mirrors M1 to M6, the sum of Petzval terms should be zero or nearly zero as expressed by Equations 2 and 3. While the fifth mirror M5 is a convex mirror, use of a convex mirror or a plane mirror for other mirrors would have an effect of reducing the sum of Petzval terms, or easily flattening the image surface.

$$\frac{1}{r_1} - \frac{1}{r_2} + \frac{1}{r_3} - \frac{1}{r_4} + \frac{1}{r_5} - \frac{1}{r_6} \approx 0 \qquad (2)$$

$$\frac{1}{r_1} - \frac{1}{r_2} + \frac{1}{r_3} - \frac{1}{r_4} + \frac{1}{r_5} - \frac{1}{r_6} = 0 \qquad (3)$$

Although the inventive catoptric projection optical system 100 includes six mirrors, at least one or more mirrors may have an aspheric surface. Equation 4 defines a general aspheric shape. As a mirror having an aspheric surface advantageously facilitates a correction of aberration, the aspheric surface is preferably applied to many possible (desirably, six) mirrors.

$$Z = \frac{ch^2}{1 + \sqrt{1 - (1+k)c^2 h^2}} + Ah^4 + Bh^6 + Ch^8 + Dh^{10} + Eh^{12} + Fh^{14} + Gh^{16} + Hh^{18} + Jh^{20} + \ldots \qquad (4)$$

where "Z" is a coordinate in an optical-axis direction, "c" is a curvature (i.e., a reciprocal number of the radius r of curvature), "h" is a height from the optical axis, "k" a conic constant, "A" to "J" are aspheric coefficients of $4^{th}$ order, $6^{th}$ order, $8^{th}$ order, $10^{th}$ order, $12^{th}$ order, $14^{th}$ order, $16^{th}$ order, $18^{th}$ order, $20^{th}$ order, respectively.

A multilayer coating for reflecting the EUV light is applied onto a surface of each of the first to sixth mirrors M1 to M6, and serves to enhance the light. A multilayer coating that can reflect the EUV light having a wavelength of 20 nm or smaller can include, for example, a Mo/Si multilayer coating including alternately laminated molybdenum (Mo) and silicon (Si) layers or a Mo/Be multilayer coating including alternately laminating molybdenum (Mo) and beryllium (Be) layers. An optimal material is selected according to wavelengths to be used. Of course, the present invention does not limit the multilayer coating to the above materials, and may use any multilayer coating that has an operation or effect similar to that of the above.

A description will now be given of illumination experiment results using the inventive catoptric projection optical systems 100 and 100A. In FIGS. 1 and 2, MS is a reflection mask located at the object surface, and W is a wafer located at the image surface.

The catoptric projection optical systems 100 and 100A illuminate the mask MS using an illumination system (not shown) for emitting the EUV light with a wavelength of about 13.4 nm, and reflects the reflected EUV light from the mask MS via the first (convex or plane) mirror M1, the second (concave) mirror M2, the third (plane) mirror M3, the fourth (concave) mirror M4, the fifth (convex) mirror M5, and the sixth (concave) mirror M6 in this order. Then, a reduced image of the mask pattern is formed on the wafer W located at the image surface.

The catoptric projection optical systems 100 and 100A form the intermediate image IM between the second and third mirrors M2 and M3, and re-form the intermediate image IM on the wafer W via the third to six mirrors M3 to M6.

However, the first mirror M1 has various possible shapes, and the first mirror has a convex mirror in the catoptric projection optical system 100 shown in FIG. 1 and a plane mirror in the catoptric projection optical system 100A shown in FIG. 2.

The catoptric projection optical system 100 shown in FIG. 1 has a numerical aperture at the image side NA =0.24, a reduction =¼, an object point of 128 to 136 mm, and an arc-shaped image field with a width of 2 mm. Table 1 indicates the numerical values (such as radius of curvature, surface intervals, and coefficients of aspheric surfaces) of the catoptric projection optical system 100 shown in FIG. 1.

Aberrations that do not include manufacture errors in the catoptric projection optical system 100 shown in FIG. 1 are wave front aberration of 55 λrms, and static distortion of 0.93 nmPV.

The catoptric projection optical system 100 uses the first convex mirror M1, thus reduces an angle between the exit light from the first mirror M1 and the optical axis, and reflects the light near the optical axis. In addition, an intersection between the light from the second mirror M2 to the third mirror M3 and the light from the fourth mirror M4 to the fifth mirror M5 maintains the light close to the optical axis. As a result the maximum effective diameter is about 430 mm, which is extremely small and advantageous to the processing measurements. The catoptric projection optical system 100 prevents a problem of light shielding on the sixth mirror M6 that has a large effective diameter, which would occur when the light is reflected around the optical axis, by forming the intermediate image IM between the second mirror M2 and the third mirror M3.

The catoptric projection optical system 100 has an overall length of 933 mm and a small mirror's effective diameter. Therefore, the mirror barrel for the catoptric projection optical system 100 becomes small. It is necessary to maintain the inside of the mirror barrel vacuum, since the air absorbs the EUV light. The small capacity of the mirror barrel facilitates maintenance of high vacuum, and reduces a loss of the EUV light due to absorptions by gas.

Table 2 shows characteristics of light's incident angles to respective mirrors when NA is 0.25:

TABLE 1

| MIRROR NUMBERS | RADII OF CURVATURE (mm) | SURFACE INTERVALS (mm) |
|---|---|---|
| MS (MASK) | ∞ | 491.89136 |
| M1 | 3842.26663 | −391.89136 |
| M2 | 632.52970 | 782.33141 |
| M3 | ∞ | −340.56806 |
| M4 | 587.99023 | 347.08332 |
| M5 | 179.04357 | −296.95531 |
| M6 | 384.58260 | 340.95531 |
| W (WAFRR) | ∞ | |

| ASPHERIC COEFFICIENTS | K | A | B |
|---|---|---|---|
| M1 | −267.466169 | −0.780043944E−8 | 0.413260127E−12 |
| M2 | −2.62843602 | 0.1771126504E−8 | −0.104963421E−13 |
| M3 | 0 | −0.181104227812E−8 | 0.35455238427E−13 |
| M4 | −0.501489651051 | −0.499638591354E−10 | 0.551481326761E−15 |
| M5 | 0.652185965963 | 0.128818331391E−7 | −0.122530514853E−11 |
| M6 | 0.0422385684211 | 0.631614287722E−10 | 0.118302622927E−14 |

| | C | D | E |
|---|---|---|---|
| M1 | 0.821038E−16 | −0.2002547E−19 | 0.340695911E−23 |
| M2 | 0.216367766343E−18 | −0.705067342902E−21 | 0.45932705835E−24 |
| M3 | −0.65672698442E−18 | 0.2525006259565E−22 | −0.293865288006E−27 |
| M4 | 0.621448231393E−19 | −0.685646752963E−24 | −0.54845472391E−29 |
| M5 | 0.12745886225E−15 | 0.157924483326E−18 | −0.265980125498E−21 |
| M6 | 0.26360018168E−19 | −0.553148373653E−23 | 0.953035608666E−27 |

TABLE 2

| MIRROR NUMBERS | MAXIMUM VALUES | MINIMUM VALUES | DISTRIBUTIONS |
|---|---|---|---|
| M1 | 12.06° | 4.26° | 8.34° |
| M2 | 9.15° | 6.22° | 2.93° |
| M3 | 14.07° | 0.58° | 13.49° |
| M4 | 7.68° | 6.64° | 1.03 |
| M5 | 17.95° | 13.08° | 4.88° |
| M6 | 6.42° | 3.03° | 3.39° |

Referring to Table 2, the fifth mirror M5 can maintain small the maximum value of the incident angle, and very small distribution of the incident angle by receiving the convergent pencil of rays. This configuration prevents a deterioration of reflective performance of the fifth mirror M5 when a multilayer coating is applied onto the fifth mirror M5. The fifth mirror M5 in the instant embodiment has a paraxial magnification of −0.61, and an angle of the marginal ray of 14° when converted into NA of 0.25. Thus, the catoptric projection optical system 100 prevents a deterioration of reflective performance for an application of a multilayer coating, by reducing an incident-angle distribution for a mirror that has a large incident angle, and by reducing a maximum value of the incident angle for a mirror that has a large incident-angle distribution.

On the other hand, the catoptric projection optical system 100A shown in FIG. 2 has a numerical aperture at the image side NA=0.25, a reduction=¼, an object point of 126 to 130 mm, and an arc-shaped image surface with a width of 1 mm. Table 3 indicates the numerical values (such as radius of curvature, surface intervals, and coefficients of aspheric surfaces) of the catoptric projection optical system 100A shown in FIG. 2.

Aberrations that do not include manufacture errors in the catoptric projection optical system 100a shown in FIG. 1 are wave front aberration of 21 λrms, and static distortion of 2 nmPV.

The catoptric projection optical system 100A uses the first plane mirror M1, thus reduces an angle between the exit light from the first mirror M1 and the optical axis, and reflects the light near the optical axis. In addition, an intersection between the light from the second mirror M2 to the third mirror M3 and the light from the fourth mirror M4 to the fifth mirror M5 maintains the light close to the optical axis. As a result the maximum effective diameter is about 464 mm, which is extremely small and advantageous to the processing measurements. The catoptric projection optical system 100A prevents a problem of light shielding on the sixth mirror M6 that has a large effective diameter, which would occur when the light is reflected around the optical axis, by forming the intermediate image IM between the second mirror M2 and the third mirror M3.

Table 4 shows characteristics of light's incident angles to respective mirrors when NA is 0.25:

TABLE 4

| MIRROR NUMBERS | MAXIMUM VALUES | MINIMUM VALUES | DISTRIBUTIONS |
|---|---|---|---|
| M1 | 10.97° | 2.93° | 8.04° |
| M2 | 6.96° | 6.49° | 0.47° |
| M3 | 11.24° | 2.74° | 8.50° |
| M4 | 6.29° | 3.61° | 2.68 |
| M5 | 18.10° | 7.13° | 11.0° |
| M6 | 5.05° | 2.31° | 2.74° |

Referring to Table 4, the fifth mirror M5 receives convergent pencil of rays, and has a small incident-angle

TABLE 3

| MIRROR NUMBERS | RADII OF CURVATURE (mm) | SURFACE INTERVALS (mm) |
|---|---|---|
| MS (MASK) | ∞ | 630.39040422 |
| M1 | ∞ | −414.889111869 |
| M2 | 986.30700 | 1145.14669637 |
| M3 | ∞ | −455.621212317 |
| M4 | 919.99906 | 575.973223593 |
| M5 | 241.54161 | −385.799698492 |
| M6 | 472.69959 | 429.799698492 |
| W (WAFER) | ∞ | 0 |

| ASPHERIC COEFFICIENTS | K | A | B |
|---|---|---|---|
| M1 | 0.0 | 0.392913766692E−8 | −0.482700852306E−13 |
| M2 | 5.71467204258 | −0.74423961703E−9 | −0.218940230513E−14 |
| M3 | 0.0 | 0.117641302987E−9 | 0.437846210229E−13 |
| M4 | 0.262054559486 | 0.102681269079E−9 | 0.402913796893E−15 |
| M5 | −0.1333996647252 | 0.114059493627E−8 | 0.570575209799E−12 |
| M6 | 0.029253097984 | 0.419098009587E−10 | 0.284038877645E−15 |

| | C | D | E |
|---|---|---|---|
| M1 | 0.85841732904E−18 | −0.573601920195E−22 | −0.302379564719E−26 |
| M2 | −0.164265249949E−17 | 0.123119917367E−20 | −0.563252413767E−24 |
| M3 | −0.209910470364E−17 | 0.274183093663E−22 | 0.515594464729E−27 |
| M4 | −0.117081986791E−19 | 0.324154600714E−24 | −0.374245169062E−29 |
| M5 | −0.859772349117E−16 | 0.160541027121E−18 | −0.162675556918E−21 |
| M6 | −0.927844388002E−22 | 0.334753349725E−24 | −0.39683041798E−28 | distribution. In addition, the third mirror M3 has a small incident-angle distribution. The fifth mirror M5 in the instant embodiment has a paraxial magnification of −0.15, and an angle of the marginal ray of 3.3° when converted into NA of 0.25.

Thus, the catoptric projection optical systems 100 and 100A introduces convergent pencil of rays into the fifth mirror M5, and reduces an incident-angle distribution on the fifth mirror M5. Thereby, a multilayer coating of a simple structure can provide high reflectance, and prevents lowered throughput due to the deteriorated reflectance of the fifth reflective surface. In addition, the catoptric projection optical systems 100 and 100A use the first convex or plane mirror, and form the intermediate image IM by the first and second mirrors M1 and M2, thereby realizing a small effective diameter, a reduced size of an apparatus, and easy processing measurements.

From the above numerical examples of the catoptric projection optical systems 100 and 100A, the instant inventors have deduced as follows:

Since the fifth mirror M5 as a second mirror from the wafer (or image surface) has a paraxial magnification of −0.61 in the catoptric projection optical system 100 and −0.15 in the catoptric projection optical system 100A, the instant embodiment preferably maintains a paraxial magnification of a second mirror from the wafer (or image surface) in the catoptric projection optical system to be −0.14 or smaller, preferably, −0.4 or smaller. The lower limit is preferably −30 or greater.

When the catoptric projection optical systems 100 and 100A have a numerical aperture of 0.25 or greater, the convergent pencil of rays incident upon the fifth mirror M5 and an angle between two marginal rays of the pencil of rays is 14° and 3.3°, respectively. Therefore, when the catoptric projection optical system has a numerical aperture of 0.25 or greater, the convergent pencil of rays incident upon the second mirror from the wafer on the optical path has an angle of the marginal ray of preferably 3° or greater, more preferably 9° or greater.

Figure 3:
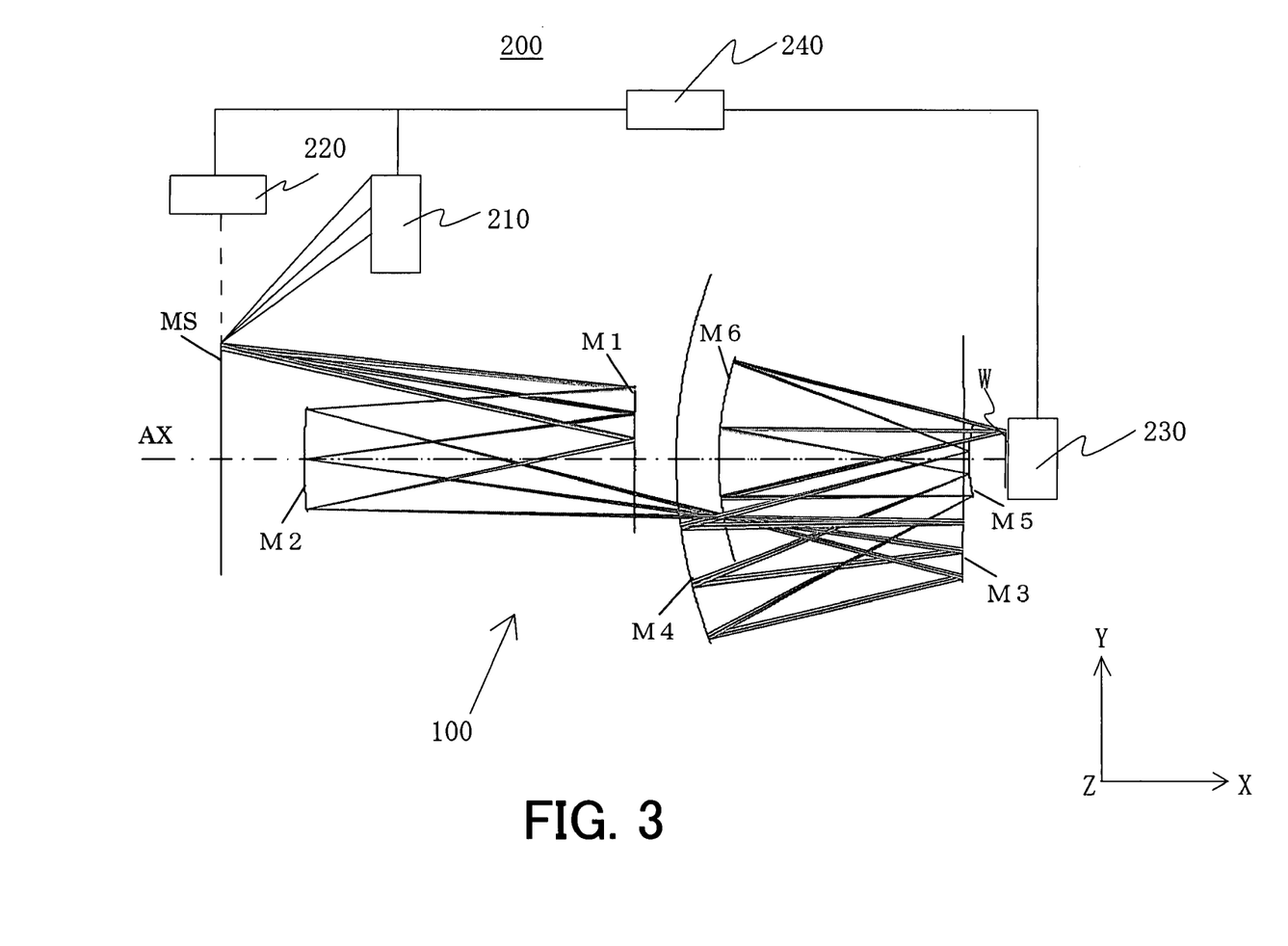
FIG. 3 is a schematic structure of an exposure apparatus that includes the catoptric projection optical system shown in FIG. 1.

Referring now to FIG. 3, a description will now be given of the exposure apparatus 200. FIG. 3 is a schematic structure of the exposure apparatus 200. The exposure apparatus 200 is a projection exposure apparatus that uses the EUV light (with a wavelength of, e.g., 13.4 nm) as illumination light for exposure, and provides a step-and-scan exposure.

The exposure apparatus 200 includes, as shown in FIG. 3, an illumination apparatus 210, a mask MS, a mask stage 220 mounted with the mask MS, a catoptric projection optical system 100, an object W, a wafer stage 230 mounted with the object W, and a controller 240. The controller 240 is connected controllably to the illumination apparatus 210, the mask stage 220 and the wafer stage 230.

At least the optical path through which the EUV light travels should preferably be maintained in a vacuum atmosphere, although not shown in FIG. 3, since the EUV light has low transmittance for air. In FIG. 3, XYZ defines a three-dimensional space, and the direction Z is a normal direction to the XY plane.

The illumination apparatus 210 uses arc-shaped EUV light (with a wavelength of, for example, 13.4 nm) corresponding to an arc-shaped field of the reflection type projection optical system, to illuminate the mask MS, and includes a light source and illumination optical system (not shown). The illumination apparatus 210 may use any technology known in the art for the light source and illumination optical system, and a detailed description thereof will be omitted. For example, the illumination optical system may include a condenser optical system, an optical integrator, an aperture stop, a blade, etc., and use any technique conceivable to those skilled in the art.

The mask MS is a reflection or transmission mask, and forms a circuit pattern (or image) to be transferred. It is supported and driven by a mask stage 220. The diffracted light emitted from the mask MS is projected onto the object W after reflected by the projection optical system 100. The mask MS and object W are arranged optically conjugate with each other. Since the exposure apparatus 200 is a step-and-scan exposure apparatus, the mask MS and object W are scanned to transfer the pattern on the mask MS, onto the object W.

The mask stage 220 supports the mask MS and is connected to a mobile mechanism (not shown). The mask stage 220 may use any structure known in the art. The mobile mechanism (not show) may use a linear motor, etc., and drives the mask stage 220 in the direction Y so as to move the mask MS under control by the controller 240. The exposure apparatus 200 scans while synchronizes the mask MS and object W through the controller 240.

The catoptric projection optical system 100 is an optical system that reduces and projects a pattern on the mask MS onto the image surface. The reflection type projection optical system 100 may use any of the above embodiments, and a detailed description thereof will be omitted. Although FIG. 3 uses the reflection type optical system 100 shown in FIG. 1, the present invention is not limited to this illustrative embodiment.

The object W is a wafer in this embodiment, but may be a LCD and another object to be exposed. Photoresist is applied to the object W.

The object W is supported by the wafer stage 230. For example, the wafer stage 230 uses a linear motor to move the object W in XYZ directions. The mask MS and object W are, for example, scanned synchronously under control by the controller 240, and the positions of the mask stage 220 and wafer stage 230 are monitored, for example, by a laser interferometer and the like, so that both are driven at a constant speed ratio.

The controller 240 includes a CPU and memory (not shown) and controls operations of the exposure apparatus 200. The controller 240 is electrically connected to (a mobile mechanism (not shown) for) the mask stage 220, and (a mobile mechanism (not shown) for) the wafer stage 230. The CPU includes a processor regardless of its name, such as an MPU, and controls each module. The memory includes a ROM and RAM, and stores a firmware for controlling the operations of the exposure apparatus 200.

In exposure, the EUV light emitted from the illumination apparatus 210 illuminates the mask MS, and the pattern on the mask MS onto the object W. The instant embodiment provides a circular or arc-shaped image field, and scans the entire surface on the mask MS by scanning the mask MS and object W with a speed ratio corresponding to the reduction ratio.

Figure 4:
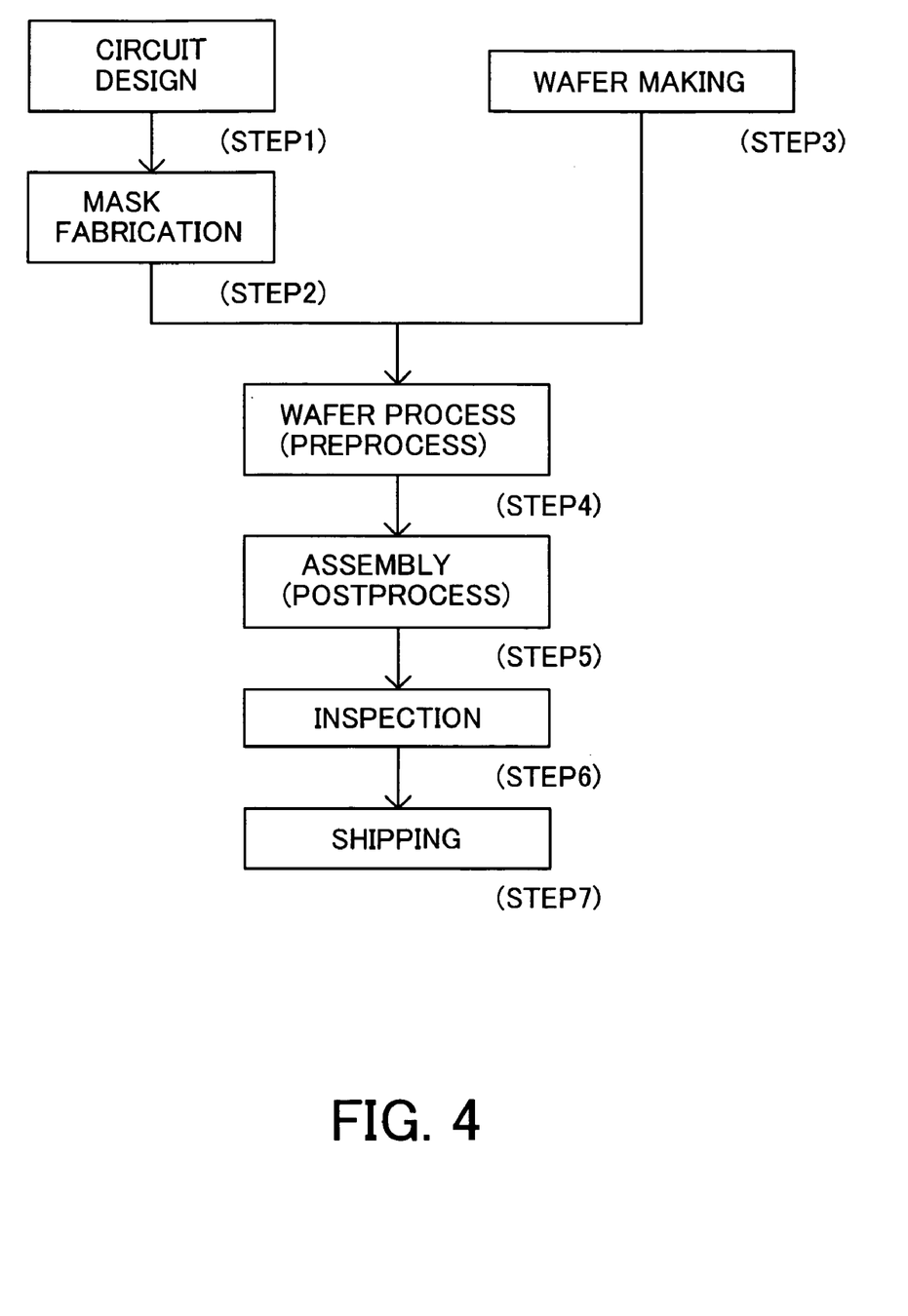
FIG. 4 is a flowchart for explaining a method for fabricating devices (semiconductor chips such as ICs, LSIs, and the like, LCDs, CCDs, etc.).
Figure 5:
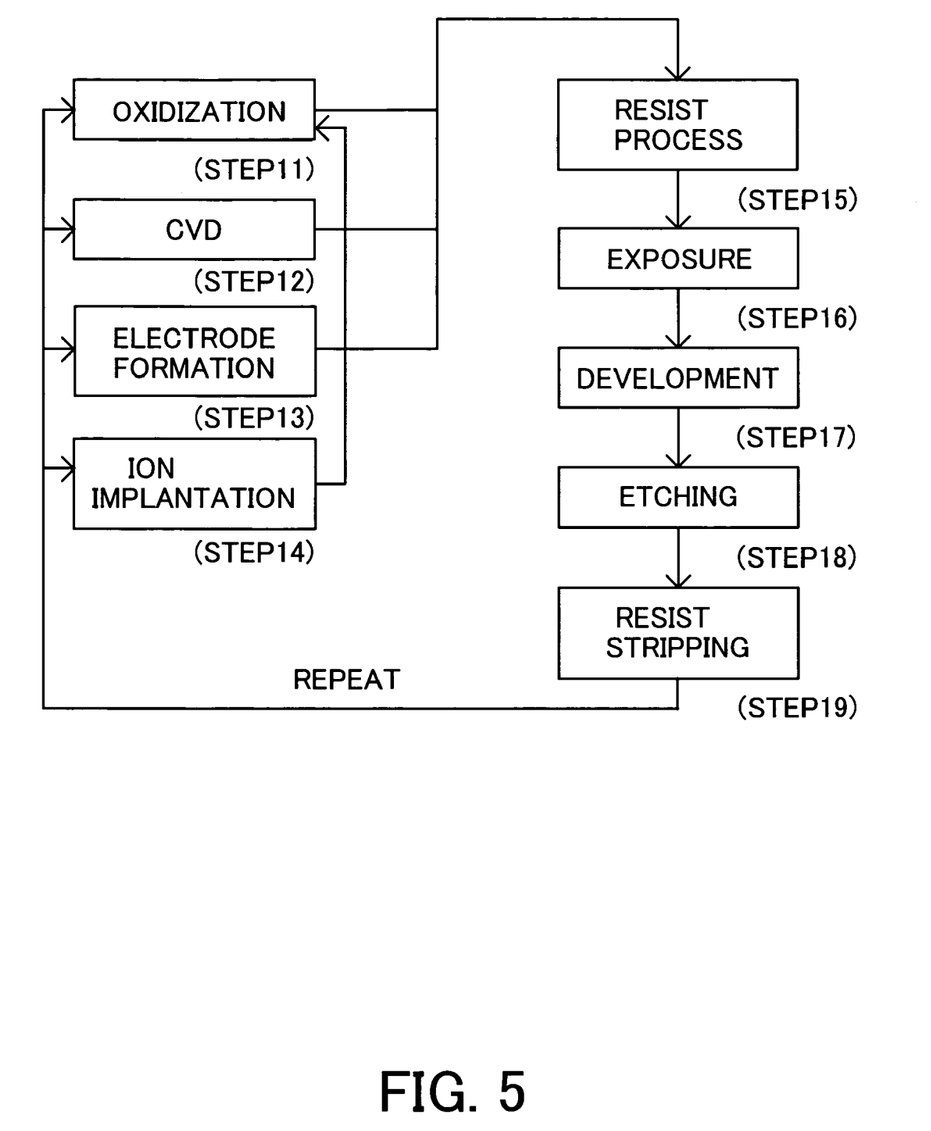
FIG. 5 is a detailed flowchart for Step 4 of wafer process shown in FIG. 4.

Referring to FIGS. 4 and 5, a description will now be given of an embodiment of a device fabricating method using the above mentioned exposure apparatus 200. FIG. 4 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 5 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus 200, and the devices as finished goods also constitute one aspect of the present invention.

Further, the present invention is not limited to these preferred embodiments, and various variations and modifications may be made without departing from the scope of the present invention. For example, the reflection type projection optical system of this embodiment has a coaxial system having a rotationally symmetrical aspheric surface, but it may have a rotationally asymmetrical aspheric surface. The present invention is applicable a reflection type projection optical system for non-EUV ultraviolet light with a wavelength of 200 nm or less, such as ArF excimer laser and $F_2$ excimer laser, as well as to an exposure apparatus that scans and exposes a large screen, or that exposes without scanning.

Thus, the present invention can provide a six-mirror catoptric projection optical system with a high NA and excellent imaging performance, and an exposure apparatus using the same, which are applicable to the EUV lithography, and reduce a maximum effective diameter and an overall length of the optical system.

What is claimed is:

1. A catoptric projection optical system for projecting a pattern on an object surface onto an image surface, said catoptric projection optical system comprising six mirrors that include, in order from the object surface to the image surface and along an optical path of said catoptric projection optical system, a first mirror, a second mirror, a third mirror, a fourth mirror, a fifth mirror, and a six mirror to sequentially reflect light, wherein the first mirror has a convex or plane shape, and the fifth mirror receives convergent pencil of rays, wherein said six mirrors are arranged, in order a near distance along an optical axis from the object surface as follows: the second mirror, the first mirror, the fourth mirror, the sixth mirror, the third mirror and the fifth mirror, wherein an intermediate image is formed between the fourth and third mirrors.

2. A catoptric projection optical system according to claim 1, wherein the intermediate image is formed between the fourth and sixth mirrors.

3. A catoptric projection optical system according to claim 1, wherein the intermediate image is formed between the six and third mirrors.

* * * * *